(12) United States Patent
Barth et al.

(10) Patent No.: US 6,453,401 B1
(45) Date of Patent: Sep. 17, 2002

(54) MEMORY CONTROLLER WITH TIMING CONSTRAINT TRACKING AND CHECKING UNIT AND CORRESPONDING METHOD

(75) Inventors: Richard M. Barth, Palo Alto; Ramprasad Satagopan, San Jose; Anil V. Godbole, Cupertino, all of CA (US)

(73) Assignee: Rambus Inc., Mountain View, CA (US)

( * ) Notice: Subject to any disclaimer, the term of this patent is extended or adjusted under 35 U.S.C. 154(b) by 0 days.

(21) Appl. No.: 09/346,682

(22) Filed: Jul. 2, 1999

(51) Int. Cl.[7] ............................................. G06F 12/00

(52) U.S. Cl. ...................... 711/167; 711/163; 711/168; 712/500

(58) Field of Search ................................ 711/150, 151, 711/152, 156, 163, 167, 168; 713/400, 500, 502; 714/55

(56) References Cited

U.S. PATENT DOCUMENTS 4,783,730 A * 11/1988 Fischer .......................... 710/5

* cited by examiner

Primary Examiner—Matthew Kim
Assistant Examiner—Matthew D. Anderson
(74) Attorney, Agent, or Firm—Pennie & Edmonds LLP

(57) ABSTRACT

A memory controller includes a constraint tracking and checking unit for tracking and checking timing constraints imposed by respective issued commands to access a memory. A constraint tracking subunit includes multiple tracking circuits and an allocation circuit. The allocation circuit is configured to allocate a selected tracking circuit from among the multiple tracking circuits each time that a specific command is issued. The allocated tracking circuit is configured to track the timing constraint imposed by the specific command. A constraint checking subunit is configured to determine if the tracked timing constraint is pending against issuance of a generated command to access the memory and to generate a blocking signal when a timing constraint is pending against issuance of a generated command.

26 Claims, 9 Drawing Sheets

MEMORY CONTROLLER WITH TIMING CONSTRAINT TRACKING AND CHECKING UNIT AND CORRESPONDING METHOD

BRIEF DESCRIPTION OF THE INVENTION

The present invention relates generally to devices that control memory operations in memories of digital systems. In particular, it pertains to a memory controller that has a timing constraint checking unit to check timing constraints imposed on commands to access a memory.

BACKGROUND OF THE INVENTION

Commands (a.k.a. requests) to access a DRAM (dynamic random access memory), such as precharge, activate and column access commands, require a certain amount of time to complete. This means that a command to access the DRAM should be issued only when the DRAM is known to be in a state that is suitable for this access and all previous commands that have a bearing on this command have been completed. These two restrictions result in what are known as timing constraints.

A DRAM memory subsystem may include multiple devices and each device will typically include multiple banks of memory cells. When a command to access a bank of a device is issued, timing constraints are imposed on subsequent commands to access the same bank or a different bank of the device. Before a subsequent command can be issued, the timing constraints that are imposed on it by previous commands must all be satisfied. The number and duration of the timing constraints that can be imposed on a command depends on the type of command, the bank or device being accessed, process parameter values, and the DRAM technology.

Table 1 and FIG. 1 disclose and illustrate the types of timing constraints that are imposed on commands for accessing a DRAM. Trcd, Tss, and Trasmin constraints are all imposed when an activate command for a row of a bank of a device is issued. The Tss constraint is imposed on an activate command for a different row of the same bank or a row of a different bank of the device. The Trcd constraint is imposed on a subsequent column command for any column of the same bank. The Trasmin constraint is imposed on a subsequent precharge command for the same bank. Thus, the Tss constraint is imposed at the device level while the Trcd and Trasmin constraints are imposed at the bank level. When a column operation for a column of a bank of a device is issued, a Tcps constraint is imposed on a subsequent precharge command for the same bank. The Tcps constraint is therefore imposed at the bank level. Finally, Trp and Tpp constraints are imposed when a precharge command for a bank of a device is issued. The Trp constraint is imposed at the bank level on an activate command for a row of the same bank. The Tpp constraint is imposed at the device level on a precharge command for the same bank or a different bank of the same device.

TABLE 1

| Constraint Type | Maximum Constraint Time | Description |
| --- | --- | --- |
| Trcd | 30 ns | Minimum time imposed between an activate command for any row of a bank of a device and a column command for a column of the same bank. |
| Trasmin | 60 ns | Minimum time imposed between an activate command for a row of a bank of a device and a precharge command for the same bank. |
| Tss | 20 ns | Minimum time imposed between an activate command for a row of a bank of a device and an activate command for a different row of the same bank or a row of a different bank of the same device. |
| Tpp | 20 ns | Minimum time imposed between a precharge command for a bank of a device and a precharge command for the same or different bank of the same device. |
| Trp | 20 ns | Minimum time imposed between a precharge command for a bank of a device and an activate command for a row of the same bank. |
| Tcps | 20 ns | Minimum time imposed between a column command for a column of a bank of the device and a precharge command for the same bank. |

In the design of a typical DRAM controller, performance is often traded for design simplicity. For example, all commands to access a DRAM may be separated by the largest constraint time of the timing constraints. Since the Trasmin constraint in Table 1 has the largest constraint time, the controller may be hard wired so that all commands are separated by the Trasmin constraint time. This obviously reduces the complexity of the controller. But, the controller's performance is reduced since commands that can be issued earlier are delayed.

In view of the foregoing, it would be highly desirable to provide a DRAM controller that is capable of simultaneously tracking and checking each and every timing constraint applicable to a set of DRAMs. Ideally, the controller would have a simple design and provide high performance and flexibility in controlling access to various DRAMs with the same type of timing constraints but different constraint times.

SUMMARY OF THE INVENTION

A memory controller includes a constraint tracking and checking unit. Timing constraints are imposed by respective issued commands to access a memory. These commands are issued by a command issue unit in the controller.

The constraint tracking and checking unit has a constraint tracking subunit that includes multiple tracking circuits and an allocation circuit. The allocation circuit is configured to allocate a selected tracking circuit from among the multiple tracking circuits each time that a specific command is issued. The selected tracking circuit is configured to track the timing constraint imposed by the specific command.

The constraint checking subunit is configured to check if the tracked timing constraint is pending against issuance of a generated command to access the memory. This command is generated by a command generation unit in the controller.

The constraint checking subunit may have multiple checking circuits, with each checking circuit corresponding to one of the tracking circuits. The checking circuit that corresponds to the allocated tracking circuit is configured to check if the tracked timing constraint is pending against issuance of the generated command.

The allocated tracking circuit may be configured to count time to a predefined constraint time for the specific timing constraint type and generate a timeout signal (also called a timing constraint status signal or a timeout status signal) indicating whether the tracked timing constraint has expired. The allocated tracking circuit may also be configured to store an address contained in the issued command that identifies a part of the memory to which the tracked timing constraint applies.

The checking circuit corresponding to the allocated tracking circuit is therefore configured to check if the timing constraint is pending against issuance of the generated command in the following manner. First, it compares an address contained in the generated command and the address stored by the address register of the selected tracking circuit. Second, if there is a match, it determines from the timeout signal of the timer of the selected tracking circuit whether the timing constraint has expired. The checking circuit generates a constraint pending signal (also called a blocking signal) when a constraint is pending against the generated command.

Each of the tracking circuits may include a timer and an address register. The timer of the allocated tracking circuit is configured to count time to the predefined constraint time and generate the timeout signal. The address register of the allocated tracking circuit is configured to store the address contained in the issued command.

The constraint tracking and checking unit may further include a programmable register that is programmed to store a parameter value representing the predefined constraint time. The timer of the allocated tracking circuit is further configured to load the parameter value when the allocated tracking circuit is allocated. It then counts time to the predefined constraint time by counting up to or down from the parameter value.

The allocation circuit may be further configured to identify allocatable tracking circuits of the multiple tracking circuits in response to the parameter value. The number of allocatable tracking circuits will be sufficient to ensure that at least one of the allocatable tracking circuits will always be available for allocation each time that one of the issued commands is issued. The allocation circuit is therefore configured to allocate the allocated tracking circuit from among the allocatable tracking circuits.

DETAILED DESCRIPTION OF THE INVENTION

Figure 2:
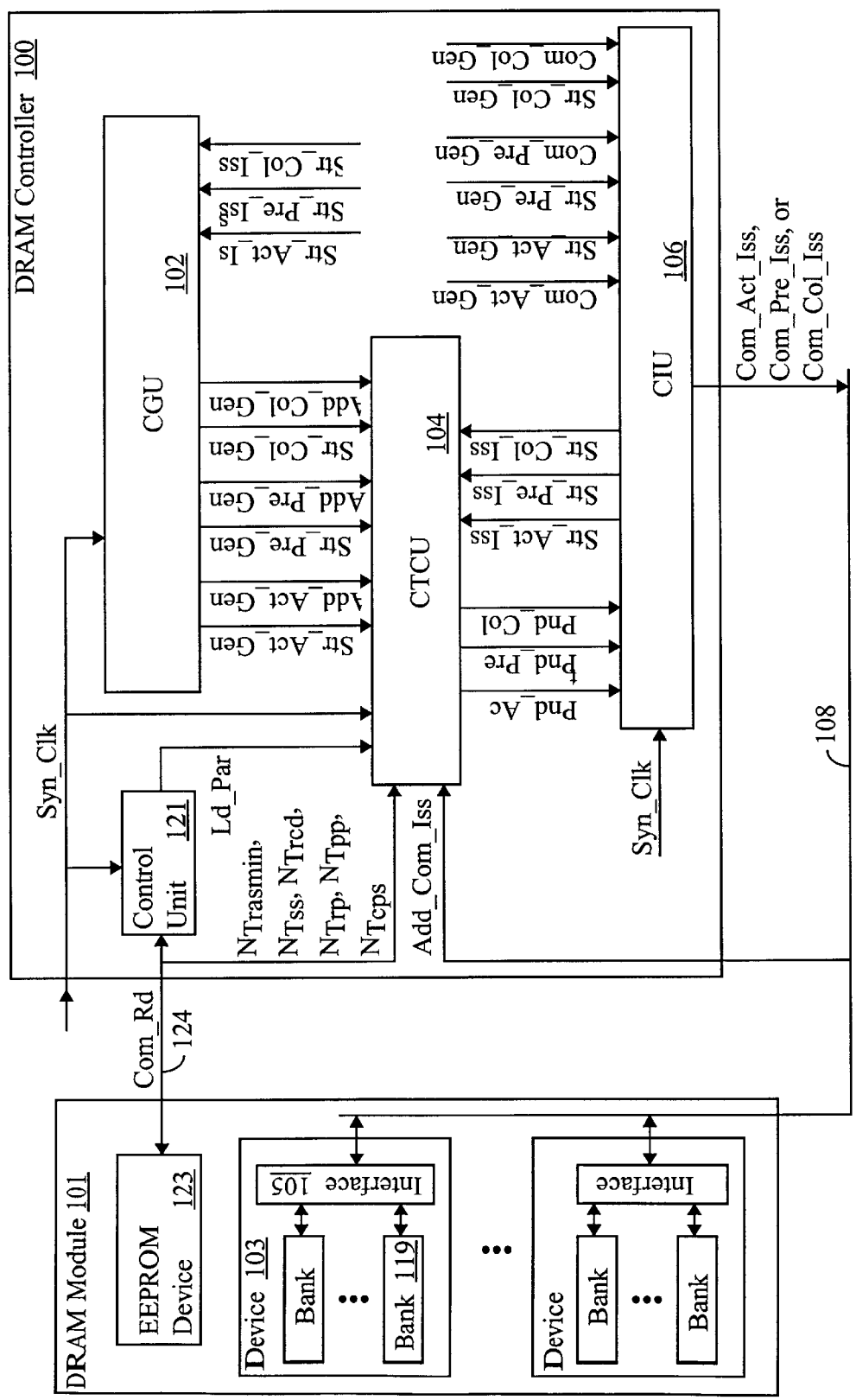
FIG. 2 provides a block diagram of a memory controller in accordance with the present invention.

Referring to FIG. 2, there is shown a DRAM controller 100 that controls access to a DRAM module 101 over an interconnect 108. The DRAM module comprises devices 103 that each include an interface 105 and a set of banks 119. The banks 119 in each device are connected to the interconnect 108 via the interface 105 of the device. The DRAM module also preferably includes an EEPROM device 123 that is connected to a separate interconnect 124.

The controller 100 comprises a CGU (command generation unit) 102, a programmable CTCU (constraint tracking and checking unit) 104, a CIU (command issue unit) 106, and a control unit 121. The controller 100 uses a clock signal, Syn_Clk, for synchronizing operations within the controller. Syn_Clk is connected to the CGU 102, CTCU 104, CIU 106 and control unit 121.

The CIU 106 is connected to the interconnect 108 to issue activate, column, and precharge commands Com_Act_Iss, Com_Col_Iss, and Com_Pre_Iss to the DRAM 101. Only one command is issued at a time in each clock cycle of the clock signal Syn_Clk. This is done in the manner to be described shortly. The CIU also generates corresponding activate, column, and precharge command issue strobes Str_Act_Iss, Str_Col_Iss, and Str_Pre_Iss to indicate when the corresponding commands have actually been issued. These command issue strobes remain active until the corresponding commands have actually been issued, and thus may be considered to be request signals (i.e., requesting issuance of the corresponding commands).

The CGU 102 generates the activate, column, and precharge commands Com_Act_Gen, Com_Col_Gen, and Com_Pre_Gen that are eventually issued by the CIU 106 as the corresponding commands Com_Act_Iss, Com_Col_Iss, and Com_Pre_Iss. The generated commands are in fact generated independently of each another. The CGU also generates activate, column, and precharge command generation strobes Str_Act_Gen, Str_Col_Gen, and Str_Pre_Gen to indicate when the corresponding commands are generated. The CGU 102 is connected to the CIU 106 and the CTCU 104 to provide both of them with the generated commands and command generation strobes. The CGU 102 is also connected to the CIU 106 to receive the command issue strobes Str_Act_Iss, Str_Col_Iss, and Str_Pre_Iss. Each generated command will continue to be provided to the CIU 106 and the CTCU 104 until the corresponding command issue strobe indicates that the command has been issued. During this time, the corresponding command generation strobe will indicate in each clock cycle of the clock signal Syn_Clk that the command has been generated.

Figure 1:
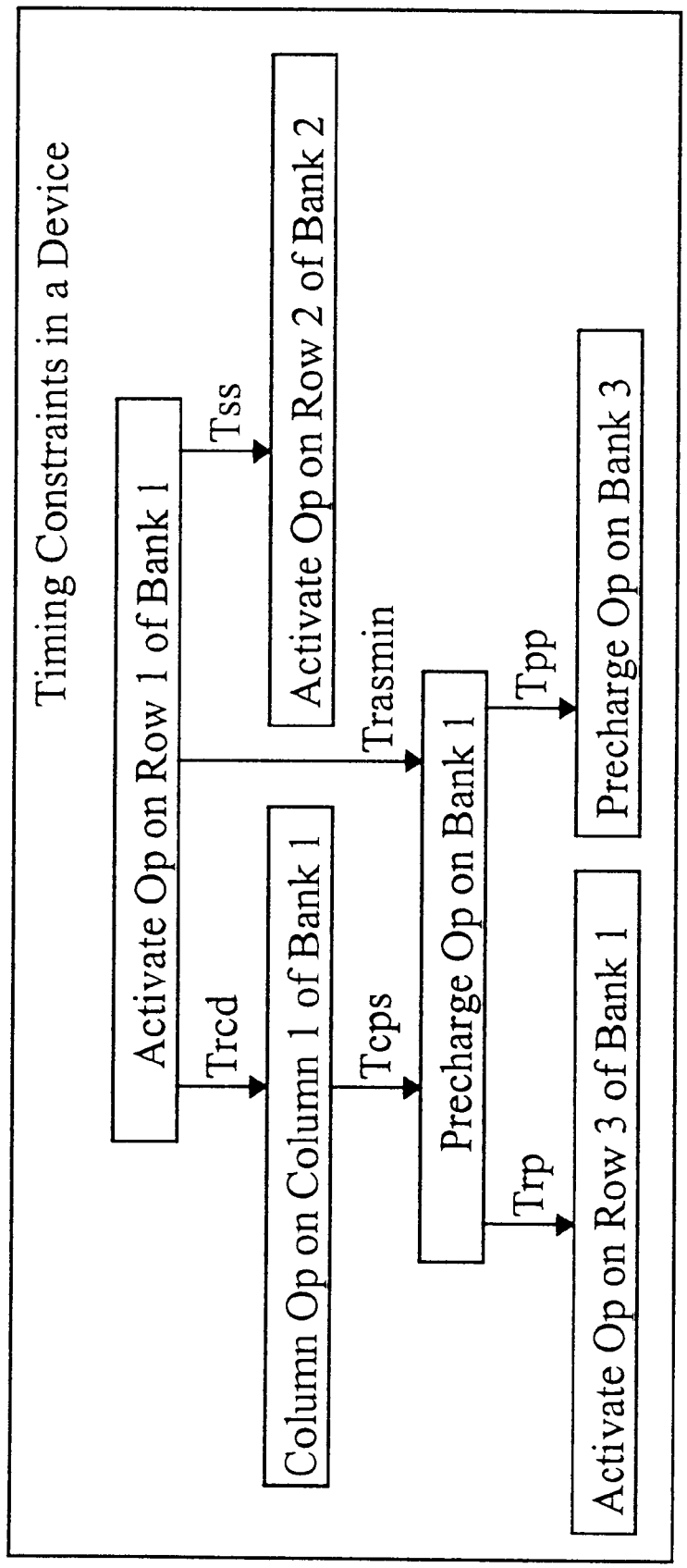
FIG. 1 illustrates an example of timing constraints imposed on commands to access a device in a DRAM.

The Trcd, Trasmin, Tss, Tcps, Tpp, and Trp constraints discussed earlier in the background section and shown in Table 1 and FIG. 1 are imposed by the issued commands Com_Act_Iss, Com_Col_Iss, and Com_Pre_Iss. As mentioned in the background section, the constraint times for these constraints may vary among different types of DRAMs. Thus, corresponding parameter values $N_{Trasmin}$, $N_{Tss}$, $N_{Trcd}$, $N_{Tcps}$, $N_{Tpp}$, and $N_{Trp}$ for the specific DRAM 101 are programmed into the CTCU 104 from the EEPROM device 123 during initialization of the controller 100. These parameter values represent the corresponding predetermined constraint times of the Trasmin, Tss, Trcd, Tcps, Tpp, and Trp constraints for the DRAM 101 (of FIG. 2). Each parameter value is determined by dividing the corresponding constraint time by the time interval (or period) in each clock cycle of the clock signal Syn_Clk. For example, the parameter value $N_{Trasmin}$ is 6 in binary form when the Trasmin constraint time is 60 ns, as given in Table 1, and the time interval for each clock cycle is 10 ns.

In order to program the parameter values $N_{Trasmin}$, $N_{Tss}$, $N_{Trcd}$, $N_{Tcps}$, $N_{Tpp}$, and $N_{Trp}$ into the CTCU 104, the control unit 121 issues a read command Com_Rd to the EEPROM device 123 over the other interconnect 124. The EEPROM device then reads out the parameter values onto this interconnect. The CTCU loads and stores these parameter values in response to a load signal Ld_Par received from the control unit 121.

The CTCU 104 is connected to the CIU 106 to receive the issue strobes Str_Act_Iss, Str_Col_Iss, and Str_Pre_Iss and is connected to the interconnect 108 to receive an address Add_Com_Iss in each issued command Com_Act_Iss, Com_Col_Iss, and Com_Pre_Iss. This address Add_Com_Iss identifies the particular device 103 and bank 119 selected for each command. This enables the CTCU to track Trasmin, Tss, Trcd, Tcps, Tpp, and Trp constraints imposed by each issued command in the manner discussed later in the section covering tracking of timing constraints.

The CTCU 104 also checks whether any of the tracked Trasmin, Tss, Trcd, Tcps, Tpp, and Trp constraints are pending against issuance of subsequently generated commands Com_Act_Gen, Com_Col_Gen, and Com_Pre_Gen. This is done in response to the command generation strobes Str_Act_Gen, Str_Col_Gen, and Str_Pre_Gen and the addresses Add_Act_Gen, Add_Col_Gen, and Add_Pre_Gen in the corresponding commands received from the CGU 102. The CTCU independently generates constraint pending signals Pnd_Act, Pnd_Col, and Pnd_Pre to indicate whether there any pending constraints against issuance of the corresponding generated commands. The constraint pending signals are also called blocking signals because they are used to block (i.e., delay) issuance of generated commands. This is described in more detail in the section covering checking timing constraints.

The CIU 106 is connected to the CTCU 104 to receive the pending constraint signals Pnd_Act, Pnd_Col, and Pnd_Pre. Each clock cycle of the clock signal Syn_Clk, the CIU determines whether there are Trasmin, Tss, Trcd, Tcps, Tpp, and Trp constraints pending against issuance of any generated commands Com_Act_Gen, Com_Col_Gen, and Com_Pre_Gen currently identified by the generation strobes Str_Act_Gen, Str_Col_Gen, and Str_Pre_Gen. The CIU then arbitrates between the generated commands which have no pending constraints against them since only one command can be issued in each clock cycle of the clock signal Syn_Clk. Each issued command Com_Act_Iss, Com_Col_Iss, and Com_Pre_Iss will impose constraints that are tracked and checked by the CTCU.

Overview of CTCU 104

Figure 3:
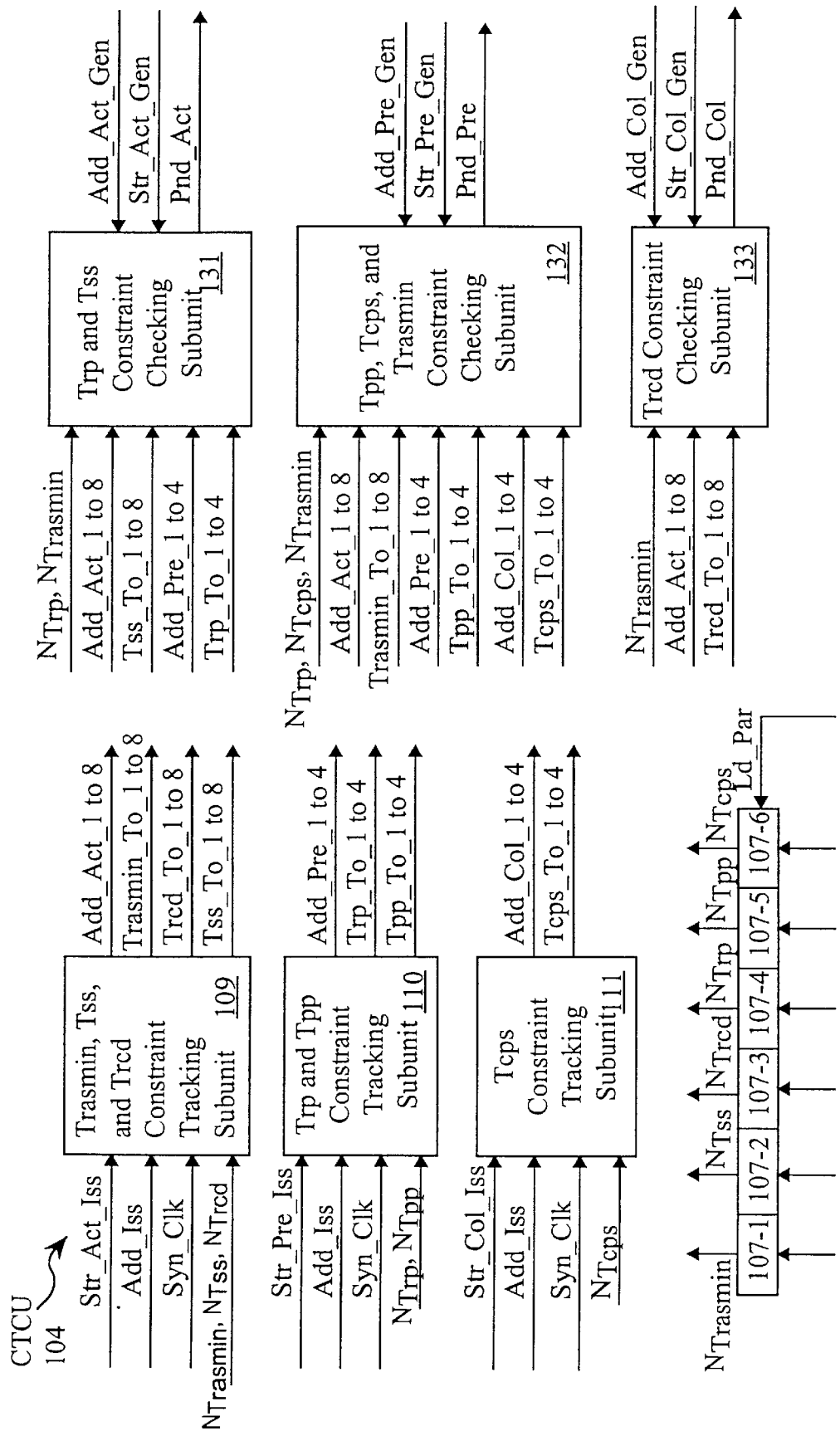
FIG. 3 provides a block diagram of one embodiment of a constraint tracking and checking unit of the memory controller of FIG. 2.

FIG. 3 shows one embodiment of the CTCU 104 for checking and tracking these timing constraints based on the parameter values $N_{Trasmin}$, $N_{Tss}$, $N_{Trcd}$, $N_{Tcps}$, $N_{Tpp}$, and $N_{Trp}$. The CTCU 104 includes three constraint tracking subunits 109, 110 and 111 to track the Trcd, Trasmin, Tss, Tcps, Tpp, and Trp constraints. The constraint tracking subunit 109 tracks the Trasmin, Tss, and Trcd constraints imposed by previously issued activate commands. The Trp and Tpp constraints imposed by previously issued precharge commands are tracked by the constraint tracking subunit 110. Similarly, the constraint tracking subunit 111 tracks the Tcps constraints imposed by previously issued column commands.

The CTCU 104 also includes three constraint checking subunits 131 to 133. The constraint checking subunit 131 checks the Trp and Tss constraints imposed on subsequently generated activate commands. The Tpp, Tcps, and Trasmin constraints imposed on subsequently generated precharge commands are checked by the constraint checking subunit 132. Similarly, the constraint checking subunit 133 checks the Trcd constraints imposed on subsequently generated column commands.

The CTCU 104 also includes registers 107-1 to 107-6. These registers load and store the respective parameter values $N_{Trasmin}$, $N_{Tss}$, $N_{Trcd}$, $N_{Tcps}$, $N_{Tpp}$, and $N_{Trp}$ received from the EEPROM device 123 (of FIG. 2) during initialization of the controller 100 (of FIG. 2). This is done in response to the load signal received from the control unit 121 (of FIG. 2). The stored parameter values are used by the subunits 109, 110, 111 and 131, 132, 133 to track and check the timing constraints imposed on subsequently generated commands in the manner discussed in the next two sections.

Tracking Timing Constraints

Figure 4:
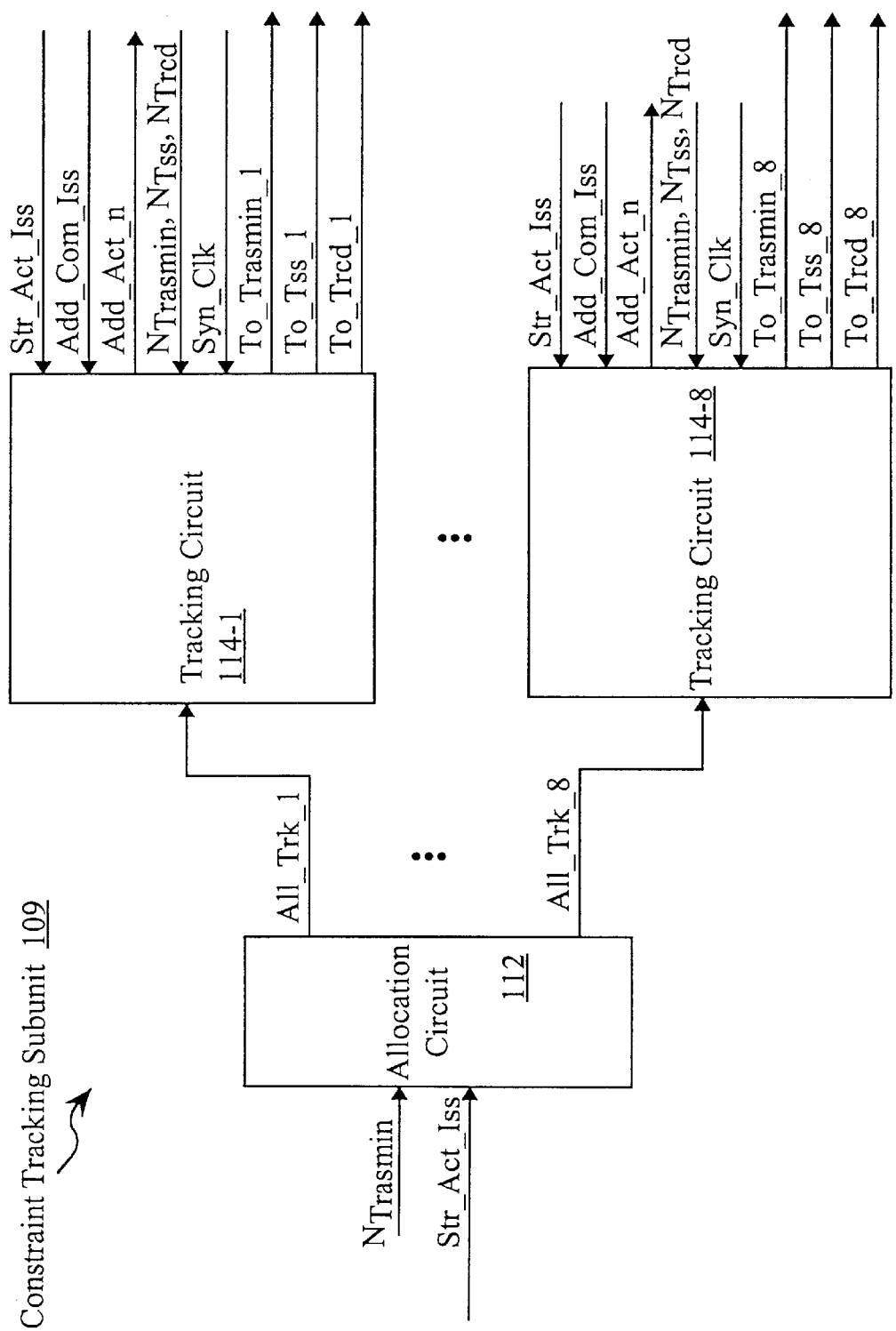
FIG. 4 provides a block diagram of one embodiment of a constraint tracking subunit in the constraint tracking and checking unit of FIG. 3.

Turning to FIG. 4, the constraint tracking subunit 109 includes an allocation circuit 112 and eight tracking circuits 114-1 to 114-8. Each tracking circuit 114-n, where $1 \leq n \leq 8$, is capable of tracking three corresponding Trasmin, Tss, and Trcd constraints Trasmin_n, Tss_n, and Trcd_n. Thus, the tracking circuits are capable of tracking a maximum of eight Trasmin constraints Trasmin_1 to Trasmin_8, eight Tss constraints Tss_1 to Tss_8, and eight Trcd constraints Trcd_1 to Trcd_8.

The allocation circuit 112 is used to allocate (i.e., assign) a selected tracking circuit 114-n to track corresponding constraints Trasmin_n, Tss_n, and Trcd_n each time that an activate command Com_Act_Iss has been issued on the interconnect 108 (of FIG. 2), at which time a Str_Act_Iss signal is sent to the CTCU 104 (FIG. 2). The selected tracking circuit is allocated from among allocatable tracking circuits 114-1 to 114-n.

The number of allocatable tracking circuits 114 that are to be used for the specific DRAM 101 (of FIG. 2) is designated by the parameter value $N_{Trasmin}$ stored in the register 107-1 (of FIG. 3). The parameter value $N_{Trasmin}$ is selected for this purpose because it is the largest of the parameter values $N_{Trasmin}$, $N_{Tss}$, and $N_{Trcd}$ and represents the largest constraint time of any of the Trasmin, Tss, and Trcd constraint times, as suggested by Table 1. This ensures that at least one tracking circuit 114-n will always be available for allocation when an activate command is issued.

This is demonstrated with the example given earlier where the parameter value $N_{Trasmin}$ is six when the Trasmin constraint time is 60 ns and each clock cycle is 10 ns. In this case, only six Trasmin constraints Trasmin_1 to Trasmin_6 can be pending at a specific time since only one activate command can be issued in each clock cycle. These six Trasmin constraints will have been imposed at six different clock cycles and will expire at six different clock cycles. At the next clock cycle (i.e., the next clock cycle in which any command can be issued), the constraint that was imposed the earliest (i.e., the one that was imposed 60 ns ago) will necessarily have expired and will no longer need to be tracked. The tracking circuit that was allocated to track this constraint is then no longer needed and is unallocated. If an activate command is issued in this same clock cycle, the same tracking circuit can be immediately re-allocated for tracking the latest constraint imposed by this command. Therefore, a maximum of six tracking circuits 114-1 to 114-6 will need to be allocated at any particular clock cycle and at least one will be available for allocation at the next clock cycle.

Since there eight tracking circuits 114-1 to 114-8 in the embodiment shown in FIG. 4, the parameter value $N_{Trasmin}$ must not be greater than eight. This limitation also applies to the parameter values $N_{Tss}$ and $N_{Trcd}$. In other embodiments where the constraint tracking subunit 109 has a different number of tracking circuits, all of these parameter values would of course be limited by this number.

Figure 5:
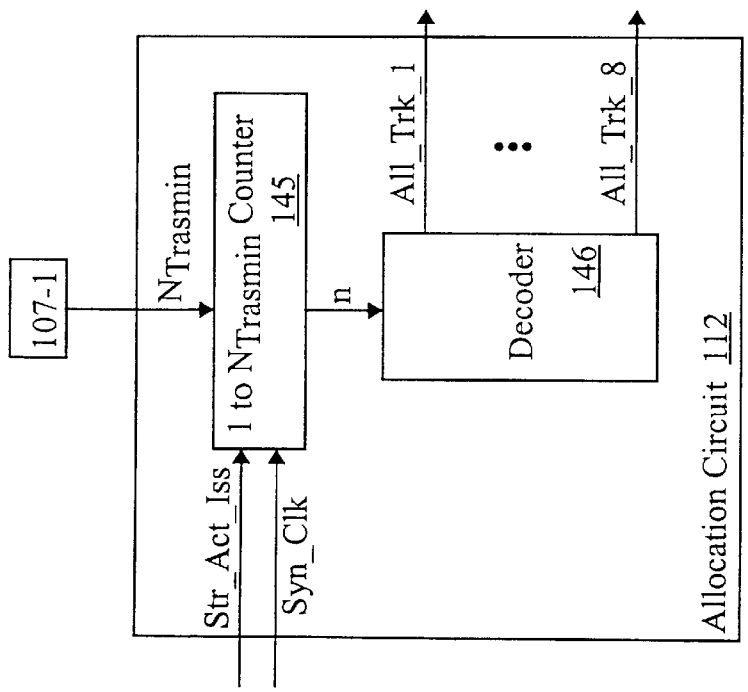
FIG. 5 provides a block diagram of the allocation circuit of the constraint tracking subunit of FIG. 4.

As shown in FIG. 5, the allocation circuit 112 includes a programmable 1 to $N_{Trasmin}$ counter 145 for selectively allocating the allocatable tracking circuits 114. This counter is programmed with the parameter value $N_{Trasmin}$ received from the register 107-1 (of FIG. 3). It also receives the activate command issue strobe Str_Act_Iss from the CIU 106 (of FIG. 2) and the clock signal Syn_Clk. Each time that the strobe Str_Act_Iss indicates that an activate command has been issued, the counter increments its counter value n by one, where $1 \leq n \leq N_{Trasmin}$. However, the new counter value n is not output until the next rising edge of the Syn_Clk clock signal. Thus the counter 145 effectively increments on the next Syn_Clk signal after each activation of the Str_Act_Iss signal.

Each time the counter value n reaches the parameter value $N_{Trasmin}$, its next value will be 1. Thus, the counter value n identifies a corresponding tracking circuit 114-n to be allocated in tracking the corresponding constraints Trasmin_n, Tss_n, and Trcd_n imposed by the command.

A decoder 146 of the allocation circuit 112 receives the counter value n from the counter 145 and decodes it. In response, the decoder generates allocation signals All_Trk_1 to All_Trk_8. The allocation signal All_Trk_n that corresponds to the counter value n will indicate the tracking circuit 114-n is in the process of being allocated. All the other allocation signals All_Trk_x (x≠n) for the other allocatable tracking circuits 114 will indicate that those tracking circuits are not in the process of being allocated and initialized. The allocation signals All_Trk_$N_{Trasmin}$+1 to All_Trk_8 for the tracking circuits 114-$N_{Trasmin}$+1 to 114-8 that cannot be allocated will always indicate that these tracking circuits have not been allocated. As those skilled in the art will recognize, the decoder may simply comprise a demultiplexer.

Figure 6:
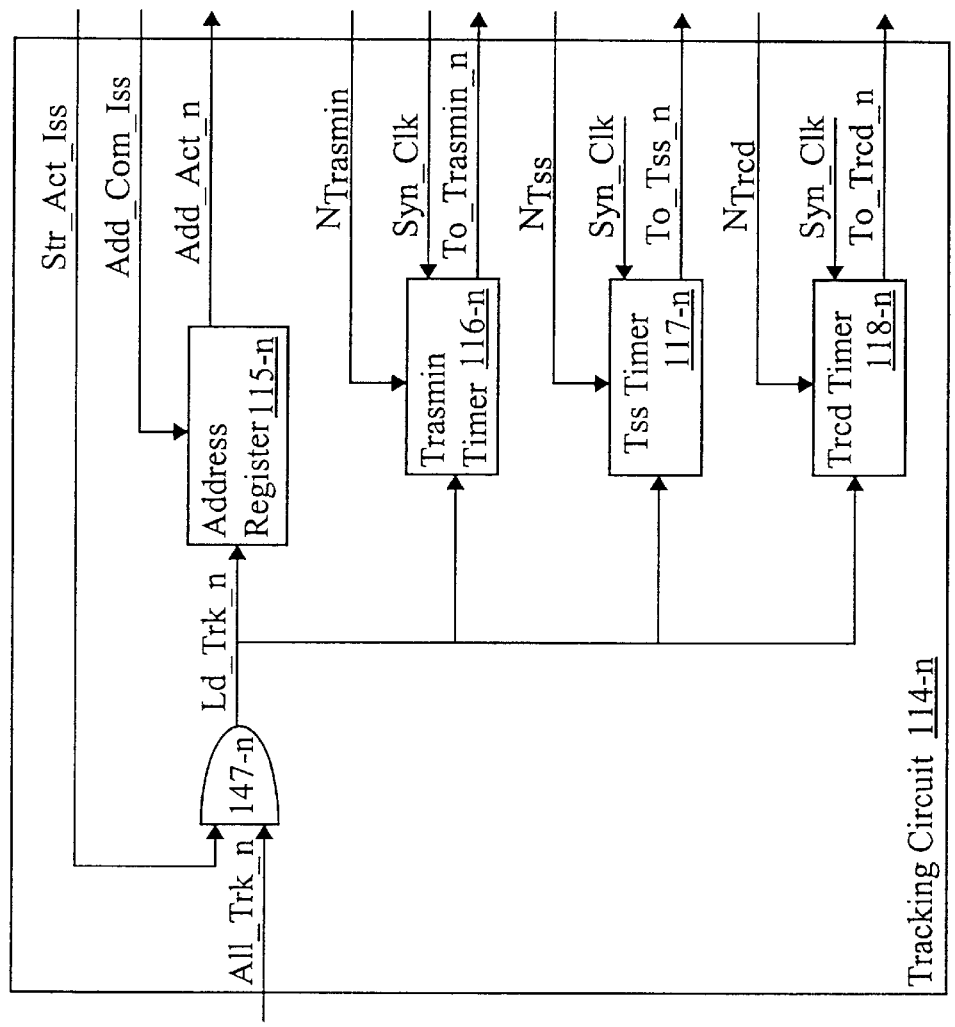
FIG. 6 provides a block diagram of one embodiment of each constraint tracking circuit of the constraint tracking subunit of FIG. 4.

Referring to FIG. 6, each tracking circuit 114-n includes an AND gate 147-n, address register 115-n, and Trasmin, Tss, and Trcd timers 116-n, 117-n, and 118-n. The AND gate logically AND's the corresponding allocation signal All_Trk_n with the issue strobe Str_Act_Iss to generate a corresponding load enable signal Ld_Trk_n. The load enable signal will indicate that loading is enabled when the issue strobe indicates that an activate command has been issued and the allocation signal indicates that the tracking circuit has just been allocated. Otherwise, the load enable signal will indicate that loading is disabled. The load enable signal is provided to the address register and the Trasmin, Tss, and Trcd timers.

When the load enable signal Ld_Trk_n indicates that loading is enabled, the address Add_Com_Iss received from the interconnect 108 (of FIG. 2) and contained in the activate command is loaded into and stored by the address register 115-n as the address Add_Act_n. This address identifies the parts of the DRAM for which the command was issued and to which the constraints Trasmin_n, Tss_n, and Trcd_n apply at the device and bank levels. The device identifying portion (i.e., bits) of this address identifies the device 103 (of FIG. 2) to which the constraint Tss_n applies. Similarly, the bank identifying portion (i.e., bits) of the address identifies the bank 119 (of FIG. 2) to which the constraints Trasmin_n and Trcd_n apply. The bank identifying portion necessarily includes the device identifying portion.

The Trasmin, Tss, and Trcd timers 116-n, 117-n, and 118-n respectively load the parameter values $N_{Trasmin}$, $N_{Tss}$, and $N_{Trcd}$ when the load enable signal Ld_Trk_n indicates that loading is enabled. These parameter values are received from the respective registers 107-1 to 107-3 (of FIG. 3). The timers then count time up to or down from these parameter values in response to the clock signal Syn_Clk (of FIG. 2). The timers provide corresponding timeout signals (also called timing constraint status signals or timeout status signals) To_Trasmin_n, To_Tss_n, and To_Trcd_n that indicate whether or not they have timed out by having counted all the way up to or down from the loaded parameter values. The timers therefore count time to the predetermined Trasmin, Tss, and Trcd constraint times represented by the corresponding parameter values $N_{Trasmin}$, $N_{Tss}$, and $N_{Trcd}$. This results in all of the constraints Trasmin_n, Tss_n and Trcd_n imposed by the issued activate command being tracked simultaneously. As those skilled in the art will recognize, the timers used for this purpose may be conventional up or down counters.

In the foregoing discussion, it was assumed that the parameter value $N_{Trasmin}$ is at least as large as the other parameter values $N_{Tss}$ and $N_{Trcd}$. If this is not the case, then the largest parameter value will be programmed into the register 107-1 (FIG. 3) instead and the other parameter values will be programmed into the other registers 107-2 and 107-3. The timers 116-n, 117-n, and 118-n in each tracking circuit 114-n will then be used to track the respective constraints corresponding to the parameter values stored in the registers 107-1 to 107-3 in a similar manner to that just discussed. This will still ensure that at least one tracking circuit 114-n will always be available for allocation when an activate command is issued.

Referring back to FIG. 3, the constraint tracking subunit 110 is configured like the constraint tracking subunit 109 and will only be discussed generally. The constraint tracking subunit 110 includes an allocation circuit and only four tracking circuits capable of tracking a maximum of four Trp constraints Trp_1 to Trp_4 and four Tpp constraints Tpp_1 to Tpp_4. The allocation circuit and each tracking circuit are configured similarly to the allocation circuit 112 (of FIG. 5) and each tracking circuit 114-n (of FIG. 6) of the constraint tracking subunit 109.

Moreover, those of the four tracking circuits that will be allocatable for the DRAM 101 (of FIG. 2) is designated by and programmed with the parameter value $N_{Trp}$ stored by the register 107-4. The parameter value $N_{Trp}$ must not be greater than 4 since there are four tracking circuits in this embodiment. This limitation also applies to the parameter value $N_{Tpp}$. In other embodiments where the constraint tracking subunit 110 has a different number of tracking circuits, both of these parameter values would be limited by this number.

In the constraint tracking subunit 110, the allocation circuit allocates a selected tracking circuit from among the allocatable tracking circuits each time that the precharge command issue strobe Str_Pre_Iss indicates that a precharge command has been issued. The selected tracking circuit tracks the corresponding constraints Trp_m and Tpp_m, where $1 \leq m \leq N_{Trp}$, imposed by this command. In tracking these constraints, the tracking circuit stores a corresponding address Add_Pre_m and provides corresponding timeout signals To_Trp_m and To_Tpp_m.

It has been assumed that the parameter value $N_{Trp}$ is at least as large as the parameter value $N_{Tpp}$. If this is not the case, then the parameter values $N_{Trp}$ and $N_{Tpp}$ will instead be programmed respectively into the registers 107-5 and 107-4. This will still ensure that at least one tracking circuit will always be available for allocation when a precharge command is issued.

Similarly, the constraint tracking subunit 111 includes an allocation circuit and four tracking circuits capable of tracking a maximum of four Tcps constraints Tcps_1 to Tcps_4. Similar to the constraint tracking subunit 110, the tracking circuits which are allocatable is designated by and programmed with the parameter value $N_{Tcps}$ stored in the register 107-6 (of FIG. 3). In this embodiment, the parameter value $N_{Tcps}$ cannot be greater than 4 since there are four tracking circuits. In other embodiments where the constraint tracking subunit has a different number of tracking circuits, the parameter value $N_{Tcps}$, would be limited by that number.

In the constraint tracking subunit 111, a selected tracking circuit is allocated from among the allocatable tracking circuits each time that the column command issue strobe Str_Col_Iss indicates that a column command has been issued. In order to do so, the allocation circuit and each tracking circuit are configured like the allocation circuit 112 (of FIG. 5) and each tracking circuit 114-n (of FIG. 6) of the constraint tracking subunit 109. The allocated tracking circuit stores a corresponding address Add_Col_k and provides a corresponding timeout signal To_Tcps_k for tracking a constraint Tcps_k imposed by the command, where $0 \leq k \leq N_{Tcps}$.

Checking Timing Constraints

Figure 7:
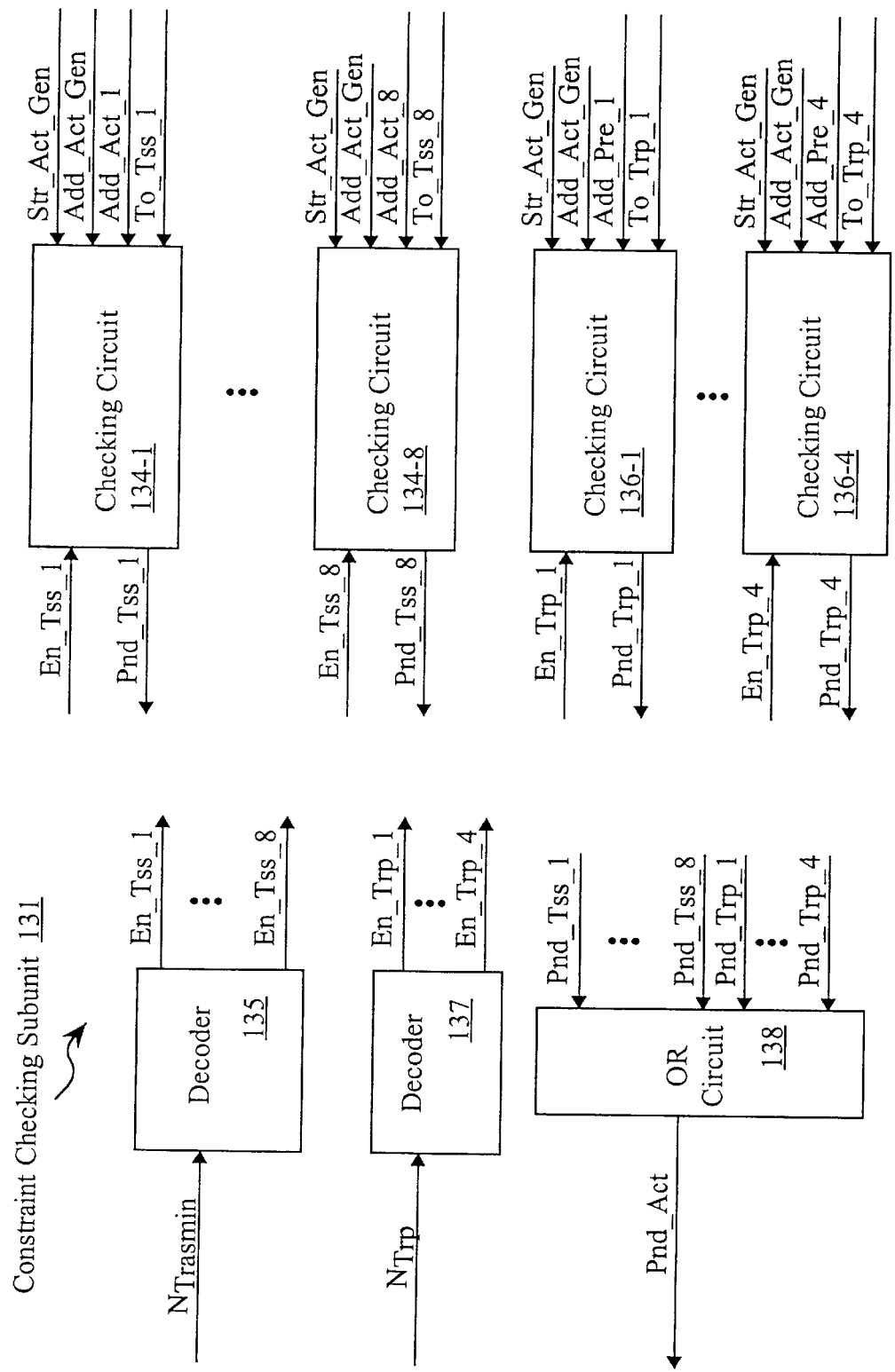
FIG. 7 provides a block diagram of one embodiment of a constraint checking subunit in the constraint tracking and checking unit of FIG. 3.

Still referring to FIG. 3, for each generated activate command, the constraint checking subunit 131 checks whether any of the Trp and Tss constraints Trp_1 to Trp_4 and Tss_1 to Tss_8 constraints tracked by the two constraint tracking subunits 109 and 110 are pending against issuance of the command. In order to do this, the constraint checking subunit 131 includes eight constraint checking circuits 134-1 to 134-8, a corresponding decoder 135, four constraint checking circuits 136-1 to 136-4, a corresponding decoder 137, and an OR circuit 138 as shown in FIG. 7.

The eight checking circuits 134-1 to 134-8 are capable of checking whether any of a maximum of eight Tss constraints Tss_1 to Tss_8 being tracked by the constraint tracking circuit 109 are pending against issuance of a generated activate command Com_Act_Gen (of FIG. 2). Each checking circuit 134-n corresponds to a tracking circuit 114-n in the constraint tracking subunit 109 (of FIG. 4). As mentioned earlier, there may be some tracking circuits 114-$N_{Trasmin}$+1 to 114-8 that are not allocatable in view of the parameter value $N_{Trasmin}$. As a result, the corresponding constraint checking circuits 134-$N_{Trasmin}$+1 to 134-7 are disabled. This is accomplished with the decoder 135.

The decoder 135 receives the parameter value $N_{Trasmin}$ from the register 107-1 (of FIG. 2). In response, the decoder generates the corresponding checking enable signals En_Tss_1 to En_Tss_8 for the checking circuits 134-1 to 134-8. Each checking enable signal En_Tss_n indicates whether the corresponding checking circuit 134-n is enabled or disabled. Thus, the checking enable signals En_Tss_1 to En_Tss_$N_{Trasmin}$ will indicate that the checking circuits 134-1 to 134-$N_{Trasmin}$ are enabled while the checking enable signals En_Tss_$N_{Trasmin}$+1 to En_Tss_8 will indicate that the checking circuits 134-$N_{Trasmin}$+1 to 134-8 are disabled.

As mentioned in the section covering tracking of timing constraints, it is assumed here that the parameter value $N_{Trasmin}$ is at least as large as the other parameter values $N_{Tss}$ and $N_{Trcd}$. If this is not the case, then the largest parameter value will be provided instead by the register 107-1 and the checking enable signals En_Tss_1 to En_Tss_8 will be generated based on it.

Figure 8:
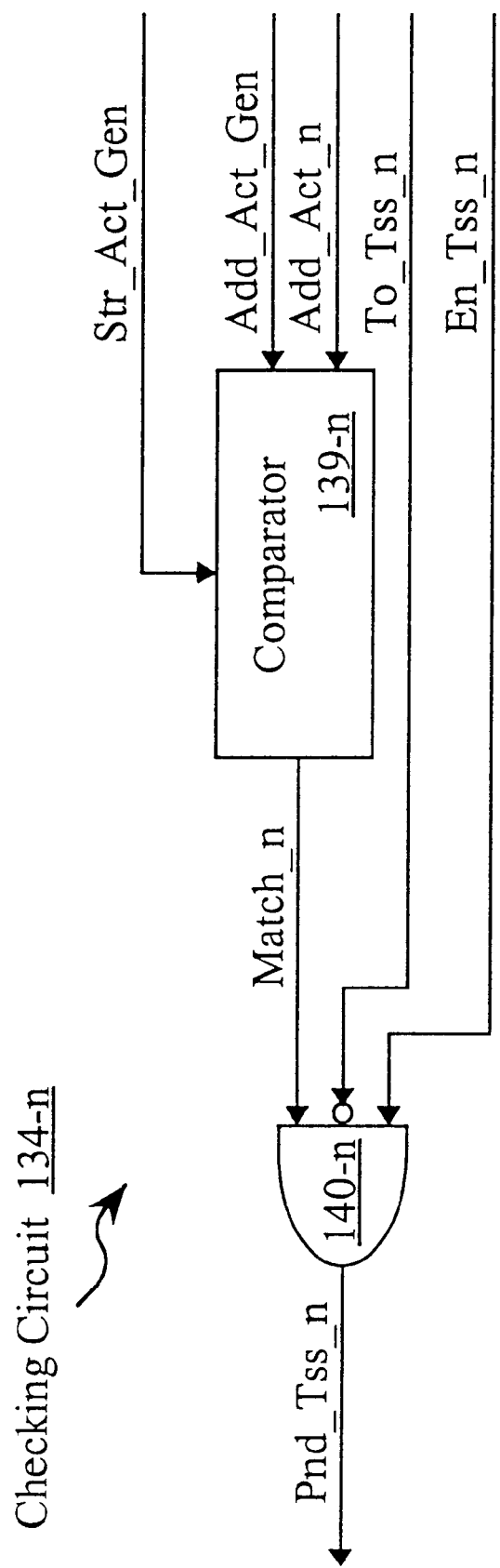
FIG. 8 provides a block diagram of one embodiment of each constraint checking circuit of the constraint checking subunit of FIG. 7.

As shown in FIG. 8, each checking circuit 134-n includes a corresponding comparator 139-n. The comparator receives the device identifying portion of the stored address Add_Act_n from the address register 115-n (of FIG. 6) of the corresponding tracking circuit 114-n (of FIG. 4). It also receives the activate command generation strobe Str_Act_Gen and the device identifying portion of the address Add_Act_Gen in each activate command from the command generation unit 102 (of FIG. 2). Each time that the strobe indicates that an activate command has been generated, the comparator compares the device identifying portions of the two addresses Add_Act_Gen and Add_Act_n. In response, the comparator generates a match signal Match_n to indicate whether there is a match. Only the device identifying portions of the two addresses are compared because each constraint Tss_n is imposed at the device level.

Each checking circuit 134-n also an AND gate 140-n. The match signal Match_n is received by the AND gate along with the timeout signal To_Tss_n from the Tss timer 117-n of the corresponding tracking circuit 114-n (of FIG. 6) and the corresponding checking enable signal En_Tss_n from the decoder 135 (of FIG. 7). The AND gate logically AND's these signals (Match_n AND En_Tss_n AND (NOT To_Tss_n)) and generates a corresponding constraint pending signal Pnd_Tss_n.

The constraint pending signal Pnd_Tss_n indicates whether the corresponding constraint Tss_n is pending against issuance of the generated activate command Com_Act_Gen (of FIG. 2). The Pnd_Tss_n signal is disabled when the checking enable signal En_Tss_n indicates that the checking circuit 134-n is disabled. When the checking circuit is enabled, the match signal Match_n and the timeout signal To_Tss_n control the outcome of the constraint pending signal.

If the match signal Match_n indicates that there is no match, this means that the generated activate command is for a different device 103 of the DRAM 101 (of FIG. 2) than the tracked device identified by the device identifying portion of the address Add_Act_n. Therefore, the constraint Tss_n tracked by the corresponding tracking circuit 114-n (of FIG. 4) is not pending against issuance of the generated activate command. The constraint pending signal Pnd_Tss_n will indicate that this is the case.

If the match signal Match_n does indicate that there is a match, then the generated activate command is for the same device 103 (of FIG. 2) that is identified by the device identifying bits of the address Add_Act_n. In this case, the constraint Tss_n may be pending against issuance of the generated activate command. This depends on whether the Tss timer 117-n in the corresponding tracking circuit 114-n has timed out. The constraint pending signal Pnd_Tss_n will indicate that the constraint Tss n is pending if the timeout signal To_Tss_n indicates that the timer has not timed out. If the timeout signal does indicate that the timer has timed out, then the constraint pending signal will indicate that the constraint Tss_n is not pending.

Referring back to FIG. 7, the four checking circuits 136-1 to 136-4 are similarly capable of checking whether any of a maximum of four Trp constraints Trp_1 to Trp_4 tracked by the constraint tracking circuit 110 are pending against issuance of a generated activate command. In this case, the decoder 137 generates corresponding checking enable signals En_Trp_1 to En_Trp_4 for the checking circuits 136-1 to 136-4 in response to the parameter value $N_{Trp}$ from the register 107-4 (of FIG. 3). This is done in a similar manner to the way in which the checking enable signals En_Tss_1 to En_Tss_8 are generated by the decoder 135 in response to the parameter value $N_{Trasmin}$. It should be noted here that if the parameter value $N_{Trp}$ is smaller then the parameter value $N_{Tpp}$, then the parameter value $N_{Tpp}$ will be provided by the register 107-4 and used instead in generating the checking enable signals.

Each checking circuit 136-m is configured similarly to each checking circuit 134-n and generates a corresponding constraint pending signal Pnd_Trp_m. The constraint pending signal Pnd_Trp_m is generated in the same way as each constraint pending signal Pnd_Tss_n with several exceptions. Here, the checking enable signal En_Trp_n, the stored address Add_Pre_m from the constraint tracking subunit 110 (of FIG. 2), and the timeout signal To_Trp_m from the constraint tracking subunit 110 (of FIG. 3) are used. Moreover, the entire addresses Add_Pre_m and Add_Act_Gen are compared since the Trp_m constraint is imposed at the bank level, unlike each Tss_n constraint.

The OR circuit 138 receives all of the constraint pending signals Pnd_Trp_1 to Pnd_Trp_4 and Pnd_Tss_1 to Pnd_Tss_8 and the activate command generation strobe Str_Act_Gen. Each time that the strobe indicates that an activate command has been generated, the OR circuit logically ORs all of the received constraint pending signals together to generate a comprehensive constraint pending signal Pnd_Act. This comprehensive constraint pending signal indicates if any of the tracked constraints Trp_1 to Trp_4 and Tss_1 to Tss_8 are currently pending against issuance of the activate command.

The constraint checking subunit 132 shown in FIG. 3 is configured similar to the constraint checking subunit 131. Each time that the precharge command generation strobe Str_Pre_Gen indicates that a precharge command has been generated, the constraint checking subunit 132 checks if any constraints Trasmin_1 to Trasmin_8, Tpp_1 to Tpp_4, and Tcps_1 to Tcps_4 being tracked by the constraint tracking subunits 109 to 111 are pending against issuance of the command. For each constraint Trasmin_n, Tpp_m, and Tcps_k, this is done in a similar manner to that described earlier for checking each constraint Tss_n and Trp_m in the constraint checking subunit 131. Thus, the constraint checking subunit 132 generates a comprehensive constraint pending signal Pnd_Pre each time that the strobe indicates that a precharge command has been generated. This signal indicates if any tracked constraints Trasmin_1 to Trasmin_8, Tpp_1 to Tpp_4, and Tcps_1 to Tcps_4 are currently pending against issuance of the precharge command.

The constraint checking subunit 133 is also configured like the constraint checking subunit 131. Each time that the column command generation strobe Str_Col_Gen indicates that a column command has been generated, this constraint checking subunit 133 checks if any of the constraints Trcd_1 to Trcd_8 being tracked by the constraint tracking subunit 109 are pending against issuance of the column command. In response, this constraint checking subunit generates a comprehensive constraint pending signal Pnd_Col to indicate if this is the case. Each constraint Trcd_n is checked in a similar manner to that described earlier for checking each constraint Tss_n in the constraint checking subunit 131.

Referring back to FIG. 2, the comprehensive constraint pending signals Pnd_Act, Pnd_Col, and Pnd_Pre are provided to the CIU 106. From these signals, the CIU determines whether there any pending timing constraints against any corresponding generated commands Com_Act_Gen, Com_Col_Gen, and Com_Pre_Gen currently provided by the CGU 102. The corresponding command generation strobes Str_Act_Gen, Str_Col_Gen, and Str_Pre_Gen received from the CGU indicate whether there are any such commands currently being provided. As mentioned earlier, the CIU then arbitrates between the generated commands that are currently provided and have no pending timing constraints against them to determine when the interconnect 108 is available for issuing them one at a time.

As also mentioned earlier, a generated command Com_Act_Gen, Com_Col_Gen, or Com_Pre_Gen will continue to be provided by the CGU 102 until it is issued by the CIU 106. Thus, the corresponding command generation strobe Str_Act_Gen, Str_Col_Gen, or Str_Pre_Gen will continue to indicate that the command has been generated each clock cycle of the clock signal Syn_Clk until the command is issued. Each time that the strobe indicates this, the CTCU 104 will check if any timing constraints are pending against issuance of it in the manner discussed earlier. While there is at least one pending timing constraint against the command, this checking process will be repeated in each clock cycle since the corresponding constraint pending signal Pnd_Act, Pnd_Col, or Pnd_Pre will continue to indicate that this is the case. Moreover, the checking process may still continue after the signal no longer indicates that there is a pending constraint against the command. This is due to the possibility that the command may still not have been issued by the CIU because the arbitration performed by the CIU resulted in other commands being issued first.

Alternative Embodiments

Referring again to FIG. 6, the unique configuration of each tracking circuit 114-n may come at a price. This is due to the possibility that the total number of Tss and Trcd timers 117-1 to 117-8 and 118-1 to 118-8 in the constraint tracking subunit 109 may be excess for certain types of DRAMs.

This may be demonstrated for a DRAM whose Trasmin, Tss, and Trcd constraint times are given in Table 1. From the example used earlier in the section covering tracking of timing constraints, the parameter value $N_{Trasmin}$ is six when the Trasmin constraint time is 60 ns and each clock cycle is 10 ns. This means that six Trasmin timers 116-1 to 116-6 are needed to track a maximum of six Trasmin constraints Trasmin_1 to Trasmin_6 that can be pending in any one clock cycle. Since the Tss and Trcd constraint times are 20 ns and 30 ns, respectively, then only two Tss timers 117-1 and 117-2 and three Trcd timers 118-1 to 118-3 are actually needed to track a maximum of two Tss constraints Tss_1 and Tss_2 constraints and a maximum of three Trcd constraints Trcd_1 to Trcd_3 that can be pending in the same clock cycle. However, four additional Tss timers 117-3 to 117-6 and three additional Trcd timers 118-4 to 118-6 are in fact used. Clearly, this problem is not as significant for a DRAM where the Tss and Trcd constraint times are larger and approach that of the Trasmin constraint time.

The grouping of a Trasmin timer 116-n, a Tss timer 117-n, and a Trcd timer 118-n together with a common address register 115-n in each tracking circuit 114-n does provide a benefit. Only eight total address registers 115-1 to 115-8 are needed for all of the tracking circuits 114-1 to 114-8. Similarly, a Trp timer and a Tpp timer are grouped together with a common address register in each tracking circuit in the constraint tracking subunit 110 of FIG. 3. Grouping the timers in this manner minimizes the total number of address registers in the CTCU 104.

Figure 9:
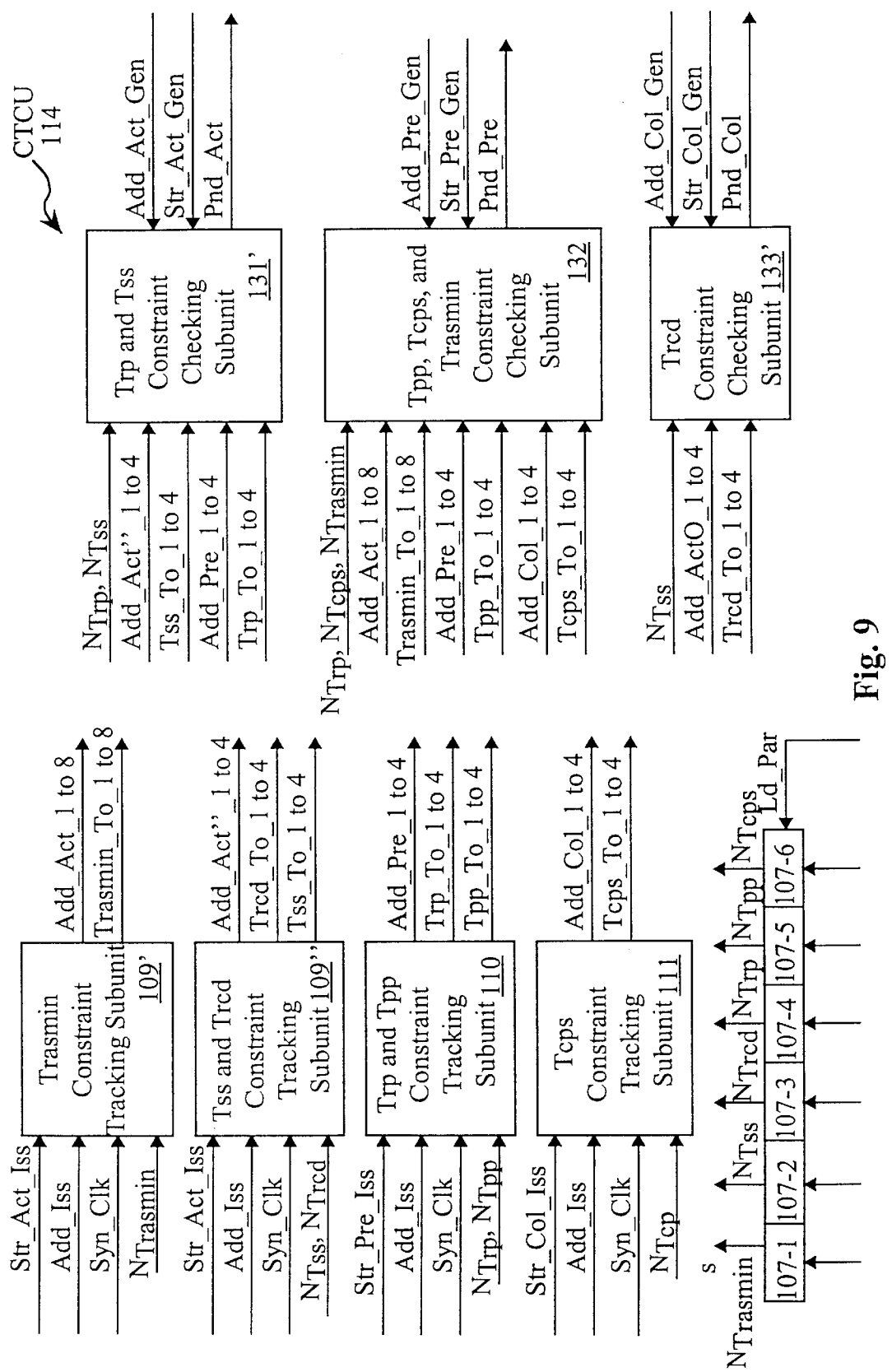
FIG. 9 provides a block diagram of another embodiment of the constraint tracking and checking unit of the memory controller of FIG. 2.

The total number of timers in the CTCU 104 may be minimized with a second embodiment, which is shown in FIG. 9. This is accomplished with two constraint tracking subunits 109' and 109" which replace and are modified versions of the constraint tracking subunit 109.

The constraint tracking circuit 109' is configured like the constraint tracking subunit 109 (of FIG. 4), except that the Tss and Trcd timers 117-n and 118-n (of FIG. 6) in each tracking circuit 114-n have been removed. Thus, it only tracks a maximum of eight Trasmin constraints Trasmin__1 to Trasmin__8.

The constraint tracking subunit 109" is also configured similar to the constraint tracking subunit 109 (of FIG. 4), but with several exceptions. It comprises four tracking circuits for tracking a maximum of four Tss constraints Tss__1 to Tss__4 and a maximum of four Trcd constraints Trcd__1 to Trcd__4. Each tracking circuit tracks corresponding constraints Tss__i and Trcd__i, where $1 \leq i \leq 4$. In order to do so, each tracking circuit includes a corresponding address register to store an address Add__Act"__i, a corresponding Tss timer to provide a timeout signal To__Tss__i, and a corresponding Trcd Timer to provide a timeout signal To__Trcd__i. This reduces the number of Tss and Trcd timers in the CTCU 104 by eight, but increases the number of address registers by four.

In this embodiment, it is assumed that the parameter value of $N_{Tss}$ is at least as large as the parameter value $N_{Trcd}$. The parameter value of $N_{Tss}$ is therefore used to designate the allocatable tracking circuits out of the four tracking circuits in the constraint tracking subunit 109".

The constraint checking subunits 131' and 133' are modified versions of the constraint checking subunits 131 and 133. Since there are only four tracking circuits in the constraint tracking subunit 109", the constraint checking subunits 131' and 133' each have only four constraint checking circuits. Each checking circuit in the constraint checking subunit 131' checks whether the constraint Tss__i being tracked by the corresponding tracking circuit in the constraint tracking subunit 109" is pending. Similarly, each checking circuit in the constraint checking subunit 133' checks whether the constraint Trcd__i being tracked by the corresponding tracking circuit is pending. This reduces the number of constraint checking circuits in the CTCU 104 by eight.

The parameter value $N_{Tss}$ is also used by the constraint checking subunits 131' and 133', which are modified versions of the constraint checking subunits 131 and 133. The constraint checking subunits 131' and 133' use this parameter value to disable those of their checking circuits which correspond to the unallocatable tracking circuits of the constraint tracking subunit 109". This is done in the same way that the parameter value $N_{Trasmin}$ was used in the constraint checking subunits 131 and 133.

In a third embodiment of the CTCU 104, both the number of address registers and timers may be minimized. As in the first embodiment of the CTCU shown in FIG. 3, this embodiment includes three constraint tracking subunits 109 to 111. However, the tracking circuits in these subunits are configured in a different way.

Figure 10:
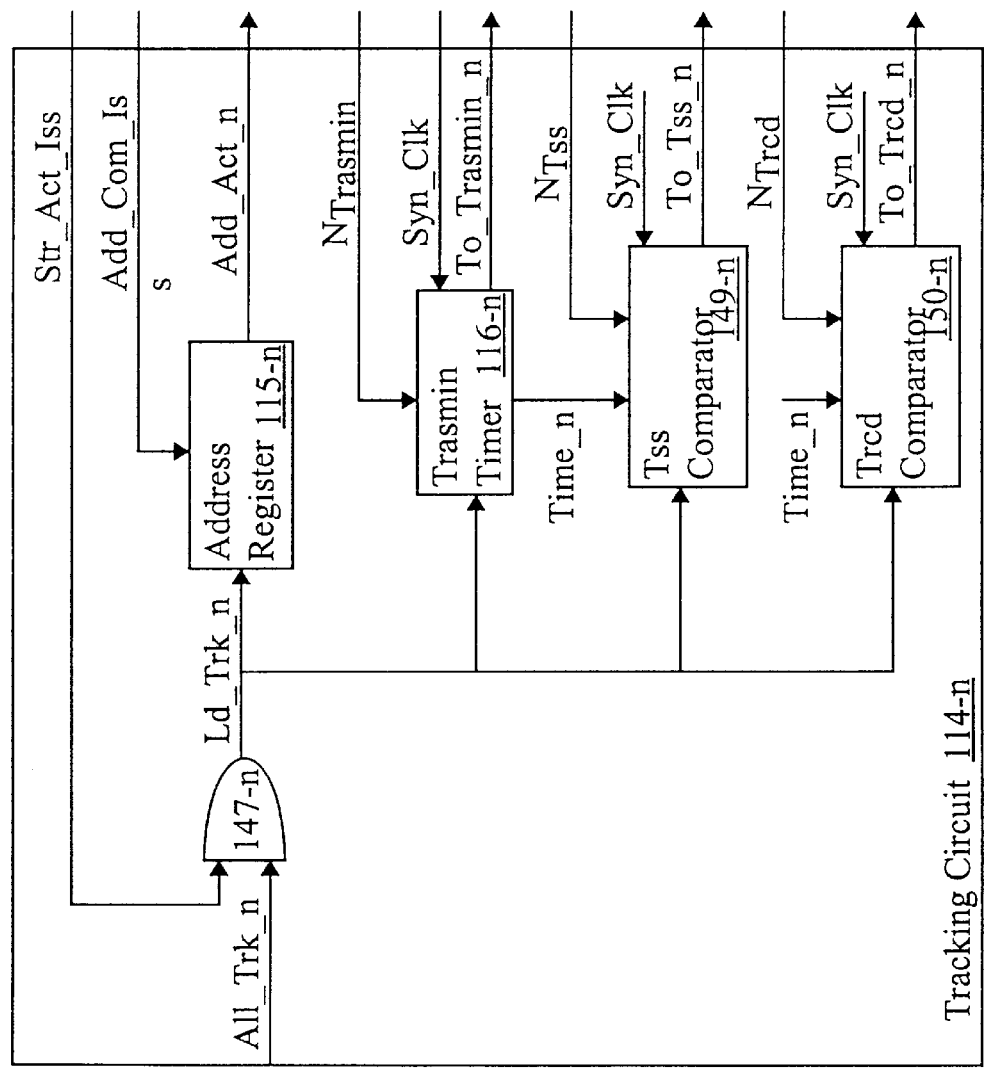
FIG. 10 provides a block diagram of another embodiment of each constraint tracking circuit of the constraint tracking subunit of FIG. 4.

FIG. 10 shows the configuration for each tracking circuit 114-n of the constraint tracking subunit 109 for this embodiment. As in the earlier configuration shown in FIG. 6, each tracking circuit tracks corresponding Trasmin__n, Tss__n, and Trcd__n constraints and includes a corresponding address register 115-n and a corresponding Trasmin timer 116-n. However, corresponding Tss and Trcd comparators 149-n and 150-n replace the Tss and Trcd timers 117-n and 118-n. The Tss and Trcd comparators each receive the timer value Time__n from the Trasmin timer 116-n, the clock signal Syn__Clk, and the load enable signal Ld__Trk__n from the allocation circuit 112. Furthermore, the Tss and Trcd comparators respectively receive the parameter values $N_{Tss}$ and $N_{Trcd}$ from the registers 107-2 and 107-3 (of FIG. 3).

When the load enable signal Ld__Trk__n (FIG. 10) indicates that loading is enabled, the Tss comparator 149-n is reset. It then compares the values Time__n and $N_{Tss}$ at each clock cycle of the clock signal Syn__Clk and generates the timeout signal To__Tss__n in response. When there is a match, the timeout signal To__Tss__n indicates that the timer 116-n has timed out for the Tss constraint. This timeout signal is then latched by the comparator until the comparator is reset again by the load enable signal.

The Trcd comparator 150-n performs the same operation with the parameter value $N_{Trcd}$. It generates the timeout signal To__Trcd__n which also will indicate that the timer 150-n has timed out for the Trcd__n constraint.

In the example just given, it is again assumed that the parameter value $N_{Trasmin}$ is at least as large as the parameter values $N_{Tss}$ and $N_{Trcd}$ so that the timeout signals To__Tss__n and To__Trcd__n will time out at the same time or before the timeout signal To__Trasmin__n does. If one of the parameter values $N_{Tss}$ and $N_{Trcd}$ is larger, then it will instead be programmed into the register 107-1 and loaded into the timer 116-n. The parameter value $N_{Trasmin}$ will then be stored in a different register 107-2 or 107-3 and the corresponding comparator 149-n or 150-n will perform the comparison just described with this parameter value.

From the foregoing, it is clear that there are only eight address registers 115-1 to 115-8 and eight timers 116-1 to 116-8 in the constraint tracking subunit 109 of this embodiment of the CTCU 104. However, this comes at the price of 16 comparators 149-1 to 149-8 and 150-1 to 150-8. Similarly, in the constraint tracking subunit 110, there might be four address registers, four timers, and four comparators.

The concept just described for this third embodiment of the CTCU 104 could also be used in a fourth embodiment that is a variation of the second embodiment shown in FIG. 9. In this case, the constraint tracking subunits 110 and 109" each will include four address registers, four timers, and four comparators.

Conclusion

It is important to note here that the invention was described for illustration purposes only in the context of tracking timing constraints imposed on commands to access a DRAM. However, those skilled in the art will recognize that the invention may also be used to track timing constraints imposed on commands to access any other type of memory.

Therefore, the invention disclosed herein comprises an improved memory controller, a programmable CTCU in the controller, and an associated method for tracking and checking timing constraints in a memory. The programmable nature of the CTCU enables the controller to be used with memories of a particular type which have the same type of timing constraints but different constraint times. At the same time, the simple design of the CTCU minimizes the hardware required to track and check these timing constraints. The controller, CTCU, and method therefore provide high performance, flexibility, and simplicity in controlling accesses to a memory.

Finally, although the present invention has been described with reference to a few specific embodiments, the description is illustrative of the invention and is not to be construed as limiting the invention. Various modifications may occur to those skilled in the art without departing from the true spirit and scope of the invention as defined by the appended claims and their equivalents.

What is claimed is:

1. A memory controller for tracking and checking timing constraints of a specific timing constraint type that are imposed by respective issued commands to access a memory, the memory controller comprising:

a command issue unit to issue the issued commands;

a constraint tracking and checking unit comprising:

a constraint tracking subunit comprising multiple tracking circuits and an allocation circuit, the allocation circuit being configured to allocate a selected tracking circuit from among the multiple tracking circuits each time that a specific command of the issued commands is issued, the allocated tracking circuit being configured to track a timing constraint imposed by the specific command and to generate a timeout status signal for each tracked timing constraint; and a constraint checking subunit, coupled to receive the timeout status signals generated by the constraint tracking subunit, and configured to generate a blocking signal when at least one tracked timing constraint is pending against issuance of a generated command to access the memory; and a command generation unit to generate the generated command;

wherein the command issue unit is configured to receive the blocking signal generated by the constraint checking subunit.

2. The memory controller of claim 1 wherein:

the constraint checking subunit comprises multiple checking circuits with a corresponding checking circuit for each of the multiple tracking circuits;

the checking circuit corresponding to the allocated tracking circuit is configured to generate a pre-blocking signal, from which the block signal is generated, when the timing constraint tracked by the allocated tracking circuit is pending against issuance of the generated command.

3. The memory controller of claim 2 wherein:

the allocated tracking circuit is configured to (a) count time to a predefined constraint time for the specific timing constraint type and generate the timeout status signal, the timeout status signal indicating whether the tracked timing constraint has expired, and (b) store an address contained in the specific command that identifies a part of the memory to which the tracked timing constraint applies;

the checking circuit corresponding to the allocated tracking circuit is configured to check if the tracked timing constraint is pending against issuance of the generated command by (a) comparing an address contained in the generated command and the address stored by the allocated tracking circuit, and (b) if there is a match, determine from the timeout status signal of the allocated tracking circuit whether the tracked timing constraint has expired.

4. The memory controller of claim 3 wherein:

each of the tracking circuits includes a timer and an address register;

the timer of the allocated tracking circuit is configured to count time to the predefined constraint time and generate the timeout status signal; and the address register of the allocated tracking circuit is configured to store the address contained in the specific command.

5. The memory controller of claim 4 wherein the constraint tracking and checking unit includes a register to store a parameter value representing the predefined constraint time; and the timer of the allocated tracking circuit is configured to load the parameter value when the allocated tracking circuit is allocated and count time to the predefined constraint time by counting up to or down from the parameter value.

6. The memory controller of claim 5 wherein the allocation circuit is further configured to allocate the allocated tracking circuit from among allocatable tracking circuits of the multiple tracking circuits in response to the parameter value, the number of allocatable tracking circuits being sufficient to ensure that at least one of the allocatable tracking circuits will always be available for allocation each time that one of the issued commands is issued.

7. The memory controller of claim 6 wherein the parameter value represents a number determined by dividing the predefined constraint time by a clock cycle time interval associated with the controller.

8. The memory controller of claim 1 wherein the memory comprises a DRAM and the specific timing constraint type is one of the group consisting of (1) a Trasmin constraint, (2) a Tss constraint, (3) a Trcd constraint, (4) a Tpp constraint, (5) a Trp constraint, and (6) a Tcps constraint.

9. The memory controller of claim 1 wherein the constraint tracking and checking unit includes a plurality of the constraint tracking subunits and a plurality of the constraint checking subunits;

each constraint tracking subunit including multiple tracking circuits and an allocation circuit, each constraint tracking subunit for tracking one or more of a predefined set of timing constraints imposed by the issued commands; and each constraint checking subunit coupled to receive the timeout status signals generated by the one or more of the constraint tracking subunits, and configured to generating a blocking signal when at least one tracked timing constraint is pending against issuance of a generated command to access the memory.

10. The memory controller of claim 9, wherein the memory comprises a DRAM; and the predefined set of timing constraints includes (1) a Trasmin constraint, (2) a Tss constraint, (3) a Trcd constraint, (4) a Tpp constraint, (5) a Trp constraint, and (6) a Tcps constraint.

11. A method of tracking and checking timing constraints of specific timing constraint types that are imposed by respective issued commands to access a memory, the method comprising the steps of:

allocating a selected tracking circuit from among multiple tracking circuits each time a specific command of the issued commands is issued;

tracking the timing constraint imposed by the specific command with the selected tracking circuit;

continuing to track timing constraints imposed by previously issued commands with previously allocated ones of the tracking circuits; and generating a blocking signal when any of the tracked timing constraints is pending against issuance of a generated command to access the memory.

12. The method of claim 11 wherein:
the first tracking step comprises the steps of:
counting time to a predefined constraint time for one of the specific timing constraint types and generating a timeout status signal indicating whether the tracked timing constraint has expired;
storing an address contained in the specific command that identifies a part of the memory to which the tracked timing constraint applies;
the generating includes determining whether the timing constraint tracked by the selected tracking circuit is pending against issuance of the generated command by:
comparing an address contained in the generated command and the stored address; and
when there is a match, determining from the timeout signal whether the tracked timing constraint has expired.

13. The method of claim 12 wherein each of the tracking circuits comprises a timer and an address register and the counting and storing steps are respectively performed with the timer and address register of the allocated tracking circuit.

14. The method of claim 13 further comprising the step of:
storing a parameter value representing the predefined constraint time in a register;
the counting time step comprising the steps of:
loading the parameter value into the timer of the allocated tracking circuit when the allocated tracking circuit is allocated;
counting time to the predefined constraint time by counting up to or down from the parameter value.

15. The method of claim 14 wherein the allocation step comprises the step of allocating the allocated tracking circuit from among allocatable tracking circuits of the multiple tracking circuits based on the parameter value, the number of allocatable tracking circuits being sufficient to ensure that at least one of the allocatable tracking circuits will always be available for allocation each time that one of the issued commands is issued.

16. The method of claim 15 wherein the parameter value represents a number determined by dividing the predefined constraint time by a clock cycle time interval associated with a memory controller in which the method is performed.

17. The method of claim 11 wherein the memory is a DRAM and the specific timing constraint type is one of the group consisting of (1) a Trasmin constraint, (2) a Tss constraint, (3) a Trcd constraint, (4) a Tpp constraint, (5) a Trp constraint, and (6) a Tcps constraint.

18. The method of claim 11 wherein
the allocating step includes allocating, in accordance with a command type associated with the specific command, one or more tracking circuits from the multiple tracking circuits, each tracking circuit allocated for the specific command tracking a distinct timing constraint imposed by the specific command; and
the tracking step includes tracking the one or more distinct timing constraints imposed by the specific command.

19. A constraint checking and tracking unit for use in a memory controller to track and check timing constraints of a specific timing constraint type that are imposed by respective issued commands to access a memory, the constraint checking and tracking unit comprising:
a constraint tracking subunit comprising multiple tracking circuits and an allocation circuit, the allocation circuit being configured to allocate a selected tracking circuit from among the multiple tracking circuits each time that a specific command of the issued commands is issued, the allocated tracking circuit being configured to track a timing constraint imposed by the specific command and to generate a timeout status signal for each tracked timing constraint; and
a constraint checking subunit, coupled to receive the timeout status signals generated by the constraint tracking subunit, and configured to generating a blocking signal when at least one tracked timing constraint is pending against issuance of a generated command to access the memory.

20. The constraint checking and tracking unit of claim 19 wherein:
the constraint checking subunit comprises multiple checking circuits with a corresponding checking circuit for each of the multiple tracking circuits;
the checking circuit corresponding to the allocated tracking circuit is configured to generate a pre-blocking signal, from which the block signal is generated, when the timing constraint tracked by the allocated tracking circuit is pending against issuance of the generated command.

21. The constraint checking and tracking unit of claim 20 wherein:
the allocated tracking circuit is configured to (a) count time to a predefined constraint time for the specific timing constraint type and generate the timeout status signal, the timeout status signal indicating whether the tracked timing constraint has expired, and (b) store an address contained in the specific command that identifies a part of the memory to which the tracked timing constraint applies;
the checking circuit corresponding to the allocated tracking circuit is configured to check if the tracked timing constraint is pending against issuance of the generated command by (a) comparing an address contained in the generated command and the address stored by the allocated tracking circuit, and (b) if there is a match, determine from the timeout status signal of the allocated tracking circuit whether the tracked timing constraint has expired.

22. The constraint checking and tracking unit of claim 21 wherein:
each of the tracking circuits includes a timer and an address register;
the timer of the allocated tracking circuit is configured to count time to the predefined constraint time and generate the timeout status signal;
the address register of the allocated tracking circuit is configured to store the address contained in the specific command.

23. The constraint checking and tracking unit of claim 22 further comprising:
a register to store a parameter value representing the predefined constraint time;
the timer of the allocated tracking circuit being configured to load the parameter value when the allocated tracking circuit is allocated and count time to the predefined constraint time by counting up to or down from the parameter value.

24. The constraint checking and tracking unit of claim 23 wherein the allocation circuit is further configured to allocate the allocated tracking circuit from among allocatable tracking circuits of the multiple tracking circuits in response to the parameter value, the number of allocatable tracking circuits being sufficient to ensure that at least one of the allocatable tracking circuits will always be available for allocation each time that one of the issued commands is issued.

25. The constraint checking and tracking unit of claim 24 wherein the parameter value represents a number determined from dividing the predefined constraint time by a time interval for each clock cycle of the controller.

26. The constraint checking and tracking unit of claim 19 wherein the memory comprises a DRAM and the specific timing constraint type is one of the group consisting of (1) a Trasmin constraint, (2) a Tss constraint, (3) a Trcd constraint, (4) a Tpp constraint, (5) a Trp constraint, and (6) a Tcps constraint.

* * * * *